US 6,688,186 B2

(12) United States Patent
Chae (10) Patent No.: US 6,688,186 B2
(45) Date of Patent: Feb. 10, 2004

(54) SLIM TYPE FINGERPRINT RECOGNITION DEVICE USING CONTACT LIGHT EMITTING DEVICE AND THIN FILM TRANSISTOR FINGERPRINT INPUT DEVICE

(75) Inventor: Sang Hoon Chae, Choongnam (KR)

(73) Assignee: Testech, Inc., Chunan-si (KR)

( * ) Notice: Subject to any disclaimer, the term of this patent is extended or adjusted under 35 U.S.C. 154(b) by 62 days.

(21) Appl. No.: 10/195,443

(22) Filed: Jul. 16, 2002

(65) Prior Publication Data

US 2003/0183019 A1 Oct. 2, 2003

(30) Foreign Application Priority Data

Mar. 29, 2002 (KR) ........................................ 2002-17381

(51) Int. Cl.[7] .................................................. G01L 1/24
(52) U.S. Cl. ................................................. 73/862.624
(58) Field of Search .................... 73/862.324, 862.624; 250/556; 356/71; 382/116, 124, 125, 126, 127; 257/40, 80, 81, 84

(56) References Cited

U.S. PATENT DOCUMENTS

| 4,740,781 A |   | 4/1988 | Brown ......................... 345/174 |
| 5,325,442 A | * | 6/1994 | Knapp .......................... 382/124 |
| 5,974,162 A | * | 10/1999 | Metz et al. ................... 382/124 |
| 6,401,551 B1 | * | 6/2002 | Kawahara et al. ...... 73/862.337 |

* cited by examiner

*Primary Examiner*—Edward Lefkowitz
*Assistant Examiner*—Corey D. Mack
(74) *Attorney, Agent, or Firm*—Fleshner & Kim, LLP

(57) ABSTRACT

A slim type fingerprint recognition device including: a TFT fingerprint input device having a structure where a plurality of unit cells including an light sensing unit and a switching unit are aligned; and a contact light emitting device being installed on the TFT fingerprint input device, the TFT fingerprint input device and the contact light emitting device being adhered to each other by an adhesive layer, one alternating current terminal being connected to a transparent electrode layer of the contact type light emitting device.

11 Claims, 14 Drawing Sheets

PRIOR ART

| Sample Material | Maxing Ratio(wt.%) |
|---|---|
| Epoxy Adhesive(Araldiet) | 50~65 % |
| Poly vinyl Butyral Past | 10~15 % |
| Ethylene Glycol Monoethyl Ether Acetate | 1~5 % |
| Diluents(n-Butyl Glycidyl Ether) | 1~5 % |
| Defoamers | 1~5 % |
| Retard | 1~4 % |

SLIM TYPE FINGERPRINT RECOGNITION DEVICE USING CONTACT LIGHT EMITTING DEVICE AND THIN FILM TRANSISTOR FINGERPRINT INPUT DEVICE

BACKGROUND OF THE INVENTION

1. Field of the Invention

The present invention relates to a slim type fingerprint recognition device using a contact light emitting device and a thin film transistor (TFT) fingerprint input device.

2. Description of the Background Art

A general fingerprint recognition device is roughly classified into an optical type using a lens or prism and a chip-based sensor using a semiconductor application technology, but the chip-based sensor gets an advantage over the other sensors. In a forthcoming mobile commerce era, an authentication sensor needs to be slim and simple. Accordingly, the present invention suggests a slim type fingerprint recognition device by using a contact light emitting device and an amorphous image sensor.

A fingerprint recognition device using a contact light emitting device and a complementary metal-oxide semiconductor (CMOS) and a plane TFT fingerprint recognition device using photosensitivity of amorphous silicon (a-Si:H) are explained as conventional arts of the present invention.

Although not illustrated, a method for forming a touch pad by using a TFT fingerprint input device and a touch pad having a fingerprint input function have been applied for registration in order to solve structural problems of a portable computer by integrating a fingerprint input device of FIG. 2a discussed later and a conventional touch pad and LCD display window (Korean Patent Unexamined Laid-open Publication No. 2001-0083355, Sep. 1, 2001). However, the aforementioned technology provides a touch pad function to the conventional fingerprint recognition device, but does not mention improvement in fingerprint recognition performance of the fingerprint recognition device.

Figure 1A:
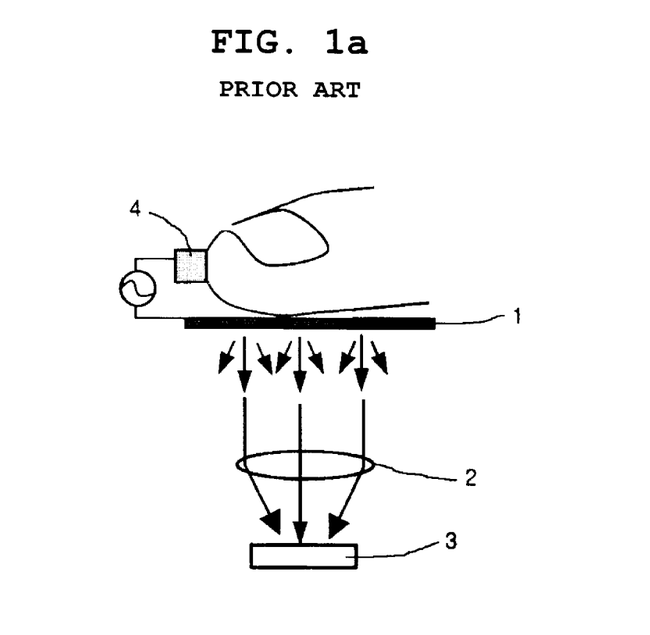
FIG. 1a is a view illustrating a construction of a conventional fingerprint input device using a CMOS image sensor.
Figure 1B:
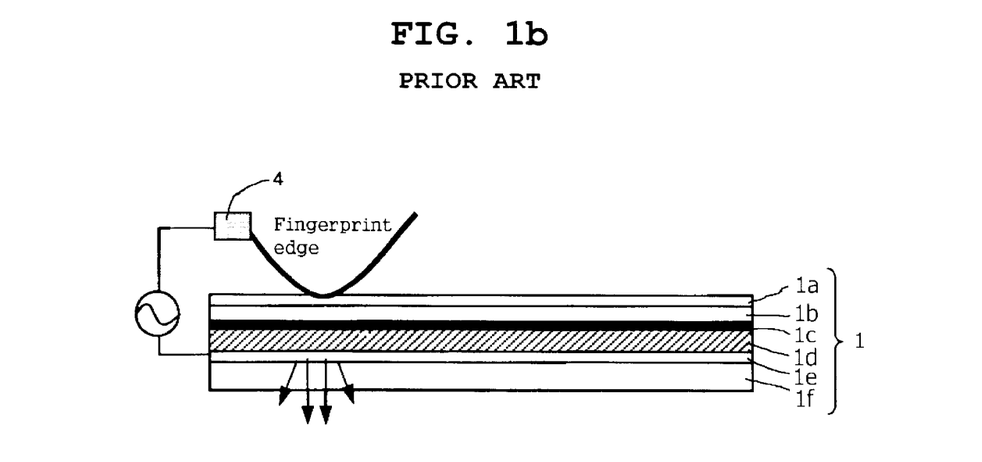
Figure 2A:
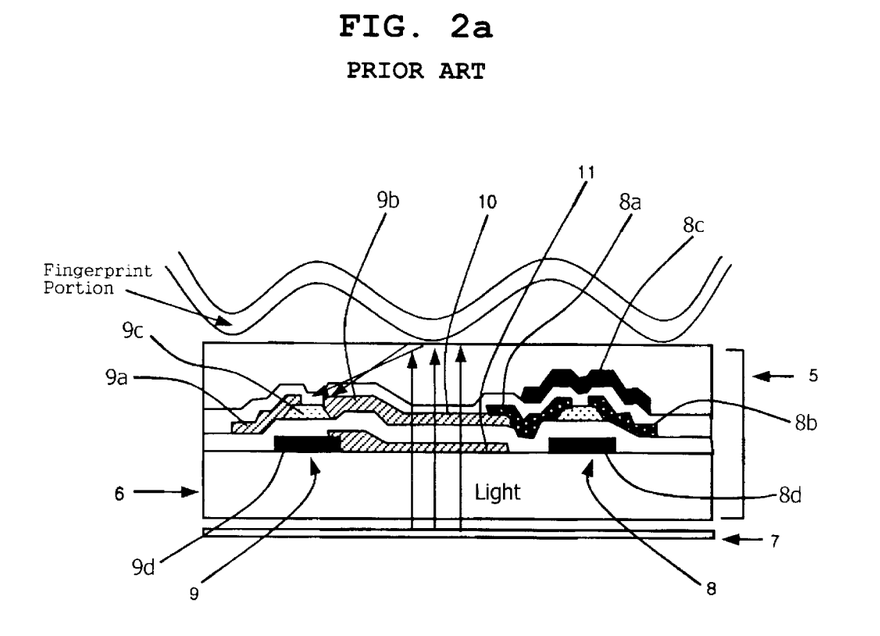
FIG. 2a is a cross-sectional view illustrating a conventional basic TFT fingerprint input device.
Figure 2B:
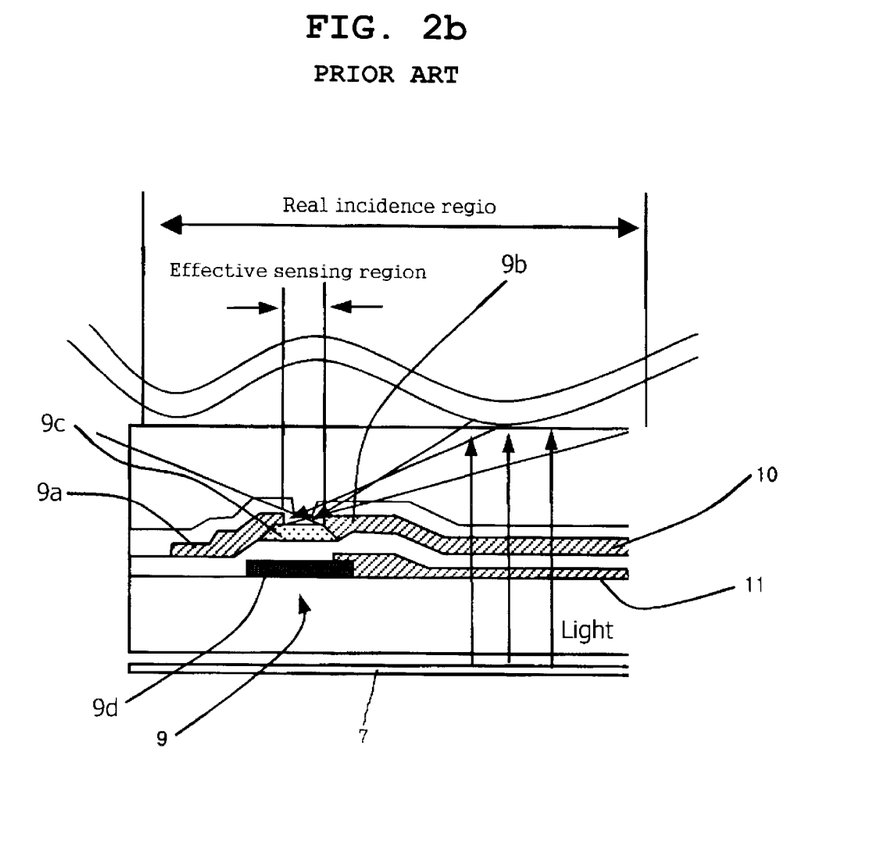

On the other hand, FIGS. 1a and 1b are views illustrating the construction of the fingerprint input device using the CMOS and the contact light emitting device, FIG. 2a is a cross-sectional view illustrating a basic TFT fingerprint input device, and FIG. 2b is a cross-sectional view illustrating a light sensing unit of the TFT fingerprint input device.

The operation of the conventional fingerprint input device will now be explained with reference to the accompanying drawings. As illustrated in FIGS. 1a and 1b, when a user contacts his/her fingerprint to the contact light emitting device 1, a fingerprint image emits light on a contact surface. The fingerprint image is collected through a lens 2 and transmitted to a CMOS image sensor 3 for recognition.

Referring to FIGS. 2a and 2b, in an LCD panel produced by TFT-LCD companies, a TFT-array substrate of a lower plate and a back-light are used except for an upper plate which is a color filter portion. Here, the device senses light reflected by a fingerprint and recognizes an image by using a photo-current, instead of using the optical system of FIG. 1a.

A photoresist layer 9c such as a-Si:H is formed between a drain electrode 9a and a source electrode 9b of the light sensing unit 9. When light is incident on the photoresist layer 9c over a predetermined light amount, the drain electrode 9a and the source electrode 9b are electrically connected. Therefore, when the fingerprint touches the TFT fingerprint input device 5, light generated from the back light below a transparent substrate 6 is reflected in fingerprint patterns, and received by the photoresist layer 9c of the light sensing unit 9, thereby electrically connecting the light sensing unit 9. Reference numeral 9d denotes a gate electrode of the light sensing unit 9.

On the other hand, a switching unit 8 is switched in every frame set up to scan fingerprints according to a gate control signal applied to a gate electrode 8d, for forming the fingerprint image inputted to the TFT fingerprint input device 5 as the frame scanned in each aligned light sensing unit 9. Accordingly, a light shielding layer 8c covers a drain electrode 8a and a source electrode 8b to protect the switching unit 8 from external light.

As described above, as shown in FIG. 1a, when the fingerprint input device is embodied in a bulk type by using the CMOS image sensor 3, not the TFT, a price and size of the device are increased.

In addition, also referring to FIG. 1a, light generated by the contact light emitting device 1 is separated from the CMOS image sensor 3, and thus the optical image of the fingerprint becomes dim in the sensor due to light loss, thus reducing image quality.

In the conventional TFT fingerprint input device, an effective sensing area of the photoresist layer 9c of the light sensing unit 9 is as large as an area of the photoresist layer 9c exposed between the drain electrode 9a and the source electrode 9b. However, a real incidence area of the fingerprint reflection light incident on the light incidence layer is much wider than that. That is, the light reflected by the fingerprint reaches the photoresist layer 9c after dispersion, and thus is incident at a wide angle. Especially in a structure where a plurality of light sensing units 9 are aligned, when the fingerprint is inputted to the real incidence area positioned between the adjacent light sensing units 9, resolution of the fingerprint pattern is deteriorated.

Differently from the optical type using the lens 2 and prism, the non-lens TFT which is the plane fingerprint recognition device cannot easily reduce the real incidence area through the lens 2 or prism.

SUMMARY OF THE INVENTION

Accordingly, it is a primary object of the present invention to provide a slim type fingerprint recognition device by using a contact light emitting device and a TFT fingerprint input device.

Another object of the present invention is to provide a fingerprint recognition device which can reduce a real incidence area to be equalized to an effective sensing area by using a contact light emitting device of a TFT fingerprint input device and the TFT fingerprint input device.

In one aspect of the present invention, to achieve the above-described objects of the invention, there is provided a slim type fingerprint recognition device including: a TFT fingerprint input device having a structure where a plurality of unit cells including an light sensing unit and a switching unit are aligned; and a contact light emitting device being installed on the TFT fingerprint input device, the TFT fingerprint input device and the contact light emitting device being adhered to each other by an adhesive layer, one alternating current terminal being connected to a transparent electrode layer of the contact type light emitting device.

In another aspect of the present invention, there is provided a slim type fingerprint recognition device using a contact type light emitting device and a TFT fingerprint input device, including: the TFT fingerprint input device (amorphous image sensor) having a structure where a plurality of unit cells including an light sensing unit and a switching unit are aligned; and the contact light emitting device installed on the TFT fingerprint input device, wherein the contact light emitting device includes: a transparent electrode layer directly deposited on the TFT fingerprint input device in a thin film type, one alternating current terminal being connected to the transparent electrode layer; a light emitting layer formed on the transparent electrode layer; a light shielding layer formed on the light emitting layer; a dielectric layer formed on the light shielding layer; and a water repellent layer (abrasion-resistant film) formed on the dielectric layer.

BRIEF DESCRIPTION OF THE DRAWINGS

The present invention will become better understood with reference to the accompanying drawings which are given only by way of illustration and thus are not limitative of the present invention, wherein:

FIG. 1b is a detailed cross-sectional view illustrating a contact light emitting device of FIG. 1a;

FIG. 2b is a detailed cross-sectional view illustrating an light sensing unit of FIG. 2a;

FIG. 3b is a detailed cross-sectional view illustrating an light sensing unit of FIG. 3a;

DETAILED DESCRIPTION OF THE PREFERRED EMBODIMENTS

A fingerprint recognition device in accordance with preferred embodiments of the present invention will now be described in detail with reference to the accompanying drawings. In the following description, same drawing reference numerals are used for the same elements even in different drawings.

Figure 3A:
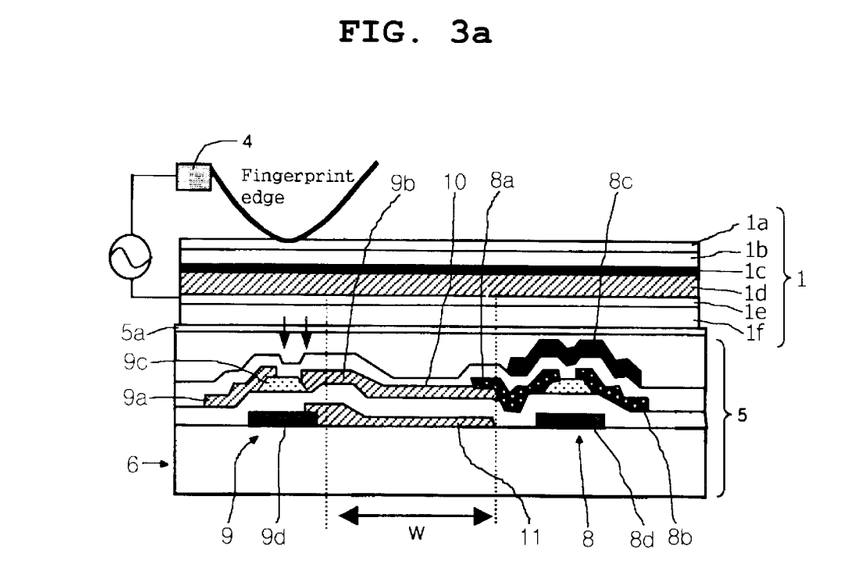
FIG. 3a is a cross-sectional view illustrating a fingerprint input device in accordance with a first embodiment of the present invention.
Figure 3B:
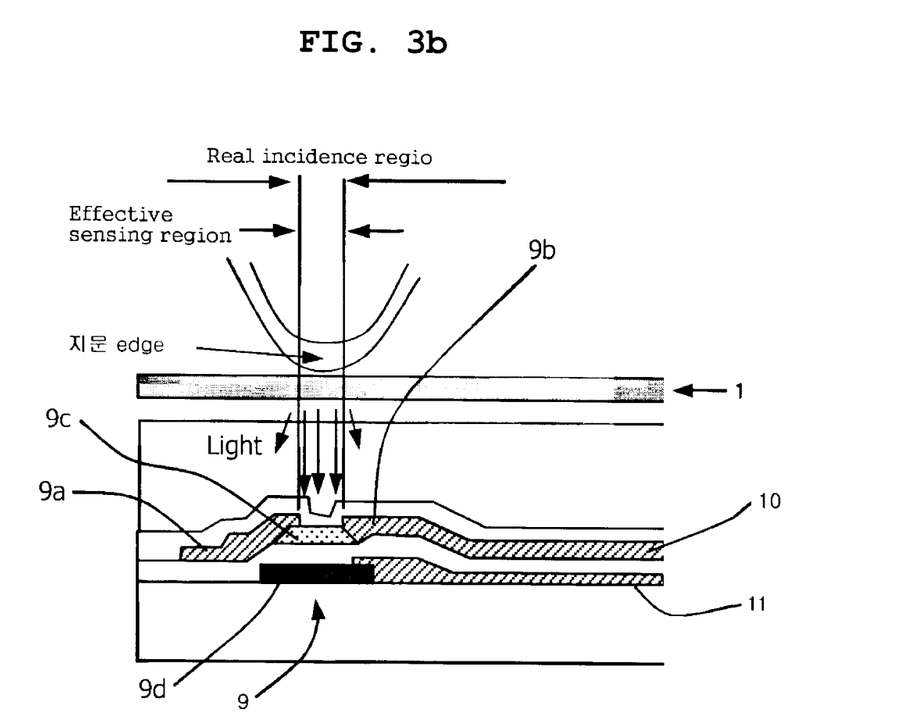
Figure 3C:
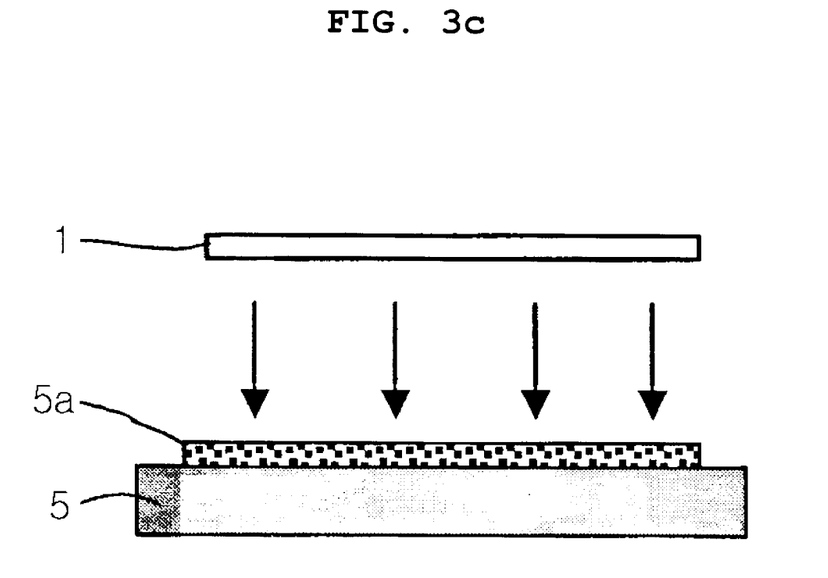
FIG. 3c is a cross-sectional view illustrating an adhesive layer formed between a contact light emitting device and a TFT fingerprint input device.

FIG. 3a is a cross-sectional view illustrating a fingerprint input device in accordance with a first embodiment of the present invention, and FIG. 3b is a detailed cross-sectional view illustrating an light sensing unit of FIG. 3a. Referring to FIG. 3a, the slim type fingerprint recognition device includes: a contact type light emitting device 1 having a transparent electrode layer 1e directly deposited on a transparent substrate 1f in a thin film type, a light emitting layer 1d for generating an optical image on the transparent electrode layer 1e, a light shielding layer 1c formed on the light emitting layer 1d, a dielectric layer 1b formed on the light shielding layer 1c, and a water repellent layer 1a formed on the dielectric layer 1b; and a TFT fingerprint input device 5. When alternating current power is applied to the transparent electrode layer 1e and a ground frame 4, and when a fingerprint touches the surface of the contact light emitting device 1 and the ground frame 4 at the same time, an optical image of the fingerprint is generated by the contact light emitting device 1, and transmitted directly to a photoresist layer 9c of the TFT fingerprint input device 5 to input the fingerprint. As depicted in FIG. 3c, an adhesive layer 5a is uniformly formed on the TFT fingerprint input device 5 according to epoxy group spraying or screen printing.

Figure 3D:
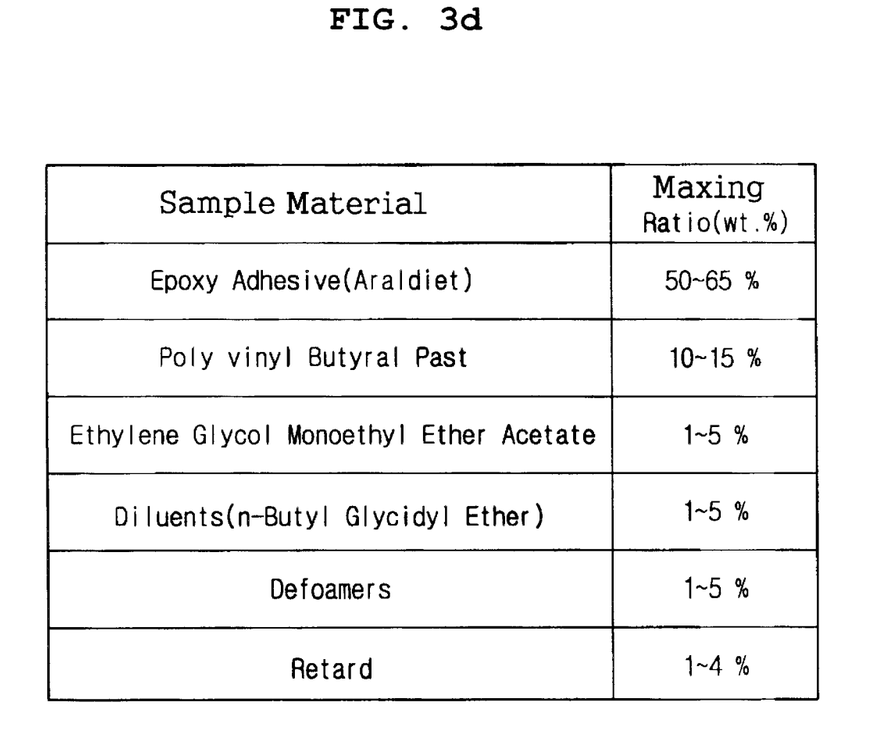
FIG. 3d is a view illustrating a percentage of a sample of the adhesive layer of FIG. 3c.

As shown in FIG. 3d, the adhesive layer 5a is prepared by mixing 55 to 60 wt % of epoxy adhesive (Araldite), 5 to 10 wt % of polyvinyl butyral paste, 1 to 5 wt % of ethylene glycol monoethyl ether acetate, 1 to 5 wt % of n-butyl glycidyl ether, 1 to 5 wt % of defoamer, and 1 to 4 wt % of retardant. In addition, the adhesive layer 5a must be transparent and maintain a pore-removed state. In this embodiment, the contact light emitting device 1 and the TFT fingerprint input device 5 are directly adhered to each other by the adhesive layer 5a. Accordingly, the light emitting image is transmitted directly to an light sensing unit of the TFT fingerprint input device 5, thereby reducing an interval (W) between the light sensing unit and a switching unit.

Since the contact light emitting device 1 is used in this embodiment, the back light 7 of FIG. 2a does not required.

Figure 4:
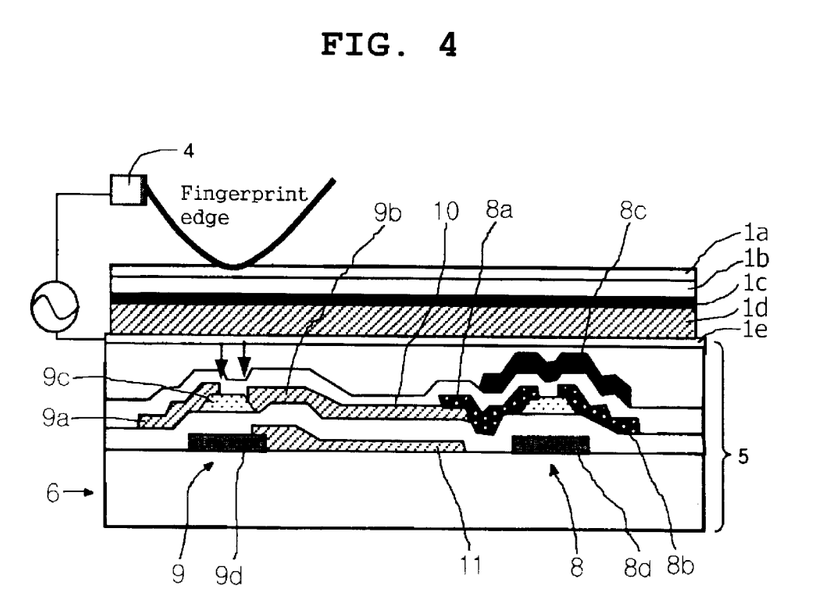
FIG. 4 is a cross-sectional view illustrating a fingerprint input device in accordance with a second embodiment of the present invention.

FIG. 4 is a cross-sectional view illustrating a fingerprint input device in accordance with a second embodiment of the present invention. Referring to FIG. 4, the fingerprint input device is extremely similar to the fingerprint input device of the first embodiment, but the difference thereof exists in the structure of the contact light emitting device. That is, the contact light emitting device 1 does not have the transparent substrate 1f. The transparent electrode layer 1e is deposited on the TFT fingerprint input device 5, and the light emitting layer 1d, the light shielding layer 1c, the dielectric layer 1b and the water repellent layer (abrasion-resistant film) 1a are sequentially stacked thereon.

Since the contact light emitting device 1 is formed on the TFT fingerprint input device 5 without using the transparent substrate 1f, a thickness of the contact light emitting device 1 is decreased.

Figure 5:
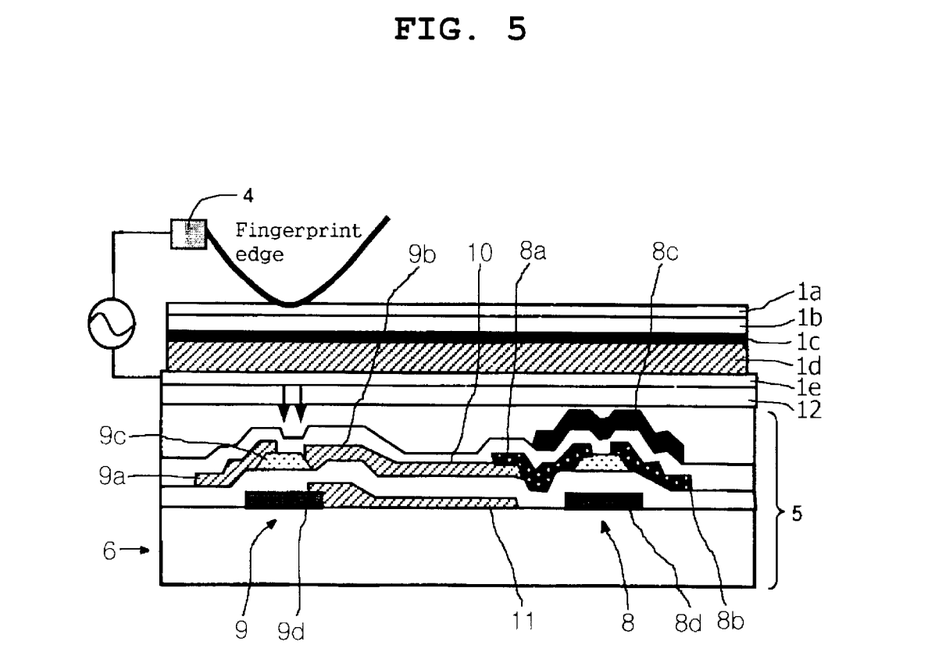
FIG. 5 is a cross-sectional view illustrating a fingerprint input device in accordance with a third embodiment of the present invention.

FIG. 5 is a cross-sectional view illustrating a fingerprint input device in accordance with a third embodiment of the present invention. As shown in FIG. 5, the fingerprint input device has a similar structure to the fingerprint input device of the second embodiment, and thus the difference thereof will now be explained. Here, a polarizing layer 12 is positioned between the contact light emitting device and the top surface of the TFT fingerprint input device. That is, the polarizing layer 12 is deposited on the TFT fingerprint input device, and the transparent electrode layer 1e, the light emitting layer 1d, the light shielding layer 1c, the dielectric layer 1b and the water repellent layer (abrasion-resistant film) 1a are sequentially stacked thereon.

The polarizing layer 12 passes vertical incident light and absorbs other elements.

Figure 6:
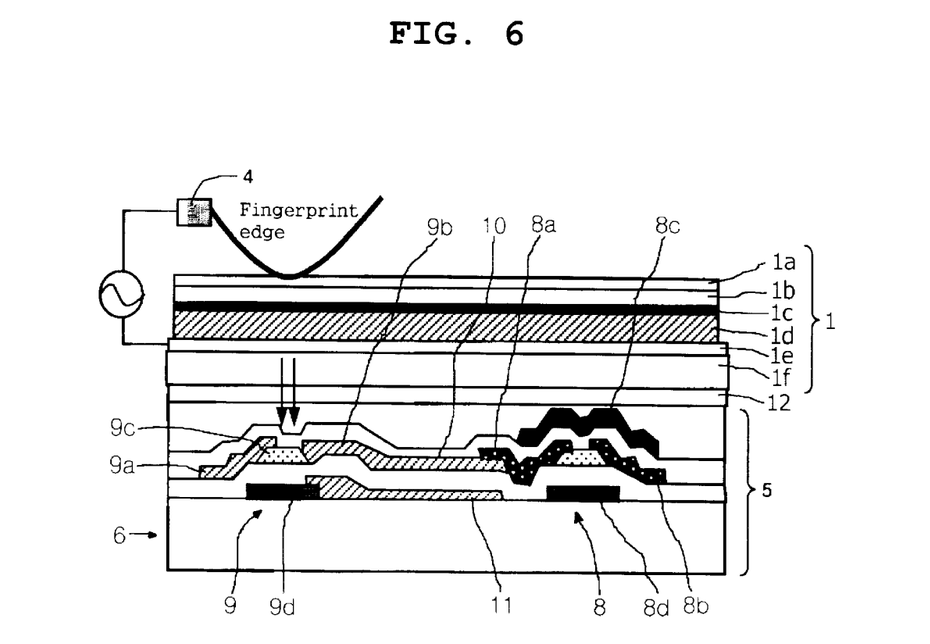
FIG. 6 is a cross-sectional view illustrating a fingerprint input device in accordance with a fourth embodiment of the present invention.

FIG. 6 is a cross-sectional view illustrating a fingerprint input device in accordance with a fourth embodiment of the present invention. As depicted in FIG. 6, the fingerprint input device is similar to the fingerprint input device of the first embodiment, but the difference thereof exists in a connection structure of the contact light emitting device and the TFT fingerprint input device. That is, the polarizing layer 12 is positioned between the transparent substrate 1f of the contact light emitting device 1 and the top surface of the TFT fingerprint input device 5. The polarizing layer 12 is adhered to the top surface of the TFT fingerprint input device 5 by an adhesive unit such as the adhesive layer of the first embodiment. In addition, the top surface of the polarizing layer 12 is adhered to the bottom surface of the transparent substrate 1f of the contact light emitting device 1 by the adhesive unit such as the adhesive layer of the first embodiment.

Figure 7:
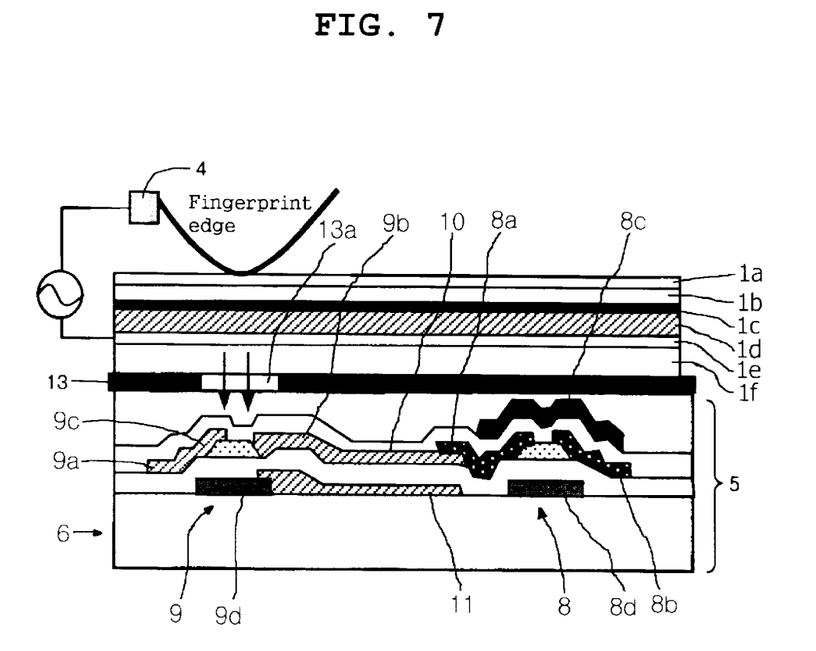
FIG. 7 is a cross-sectional view illustrating a fingerprint input device in accordance with a fifth embodiment of the present invention.

FIG. 7 is a cross-sectional view illustrating a fingerprint input device in accordance with a fifth embodiment of the present invention. Referring to FIG. 7, the fingerprint input device is similar to the fingerprint input device of the fourth embodiment, but the difference thereof exists in a connection structure of the contact light emitting device and the TFT fingerprint input device. As compared with the fourth embodiment, a light shielding pattern film 13 is positioned between the transparent substrate 1f of the contact light emitting device 1 and the top surface of the TFT fingerprint input device 5, instead of the polarizing layer 12. The light shielding pattern film 13 is deposited on the top surface of the TFT fingerprint input device 5. Here, the light shielding pattern film 13 is a black film pattern formed in an array shape of the light sensing unit of the TFT fingerprint input device 5, and includes an opening unit 13a for only opening a light incidence layer. The light shielding pattern film 13 is adhered to the contact light emitting device 1 by the adhesive unit such as the adhesive layer of the first embodiment.

Figure 8:
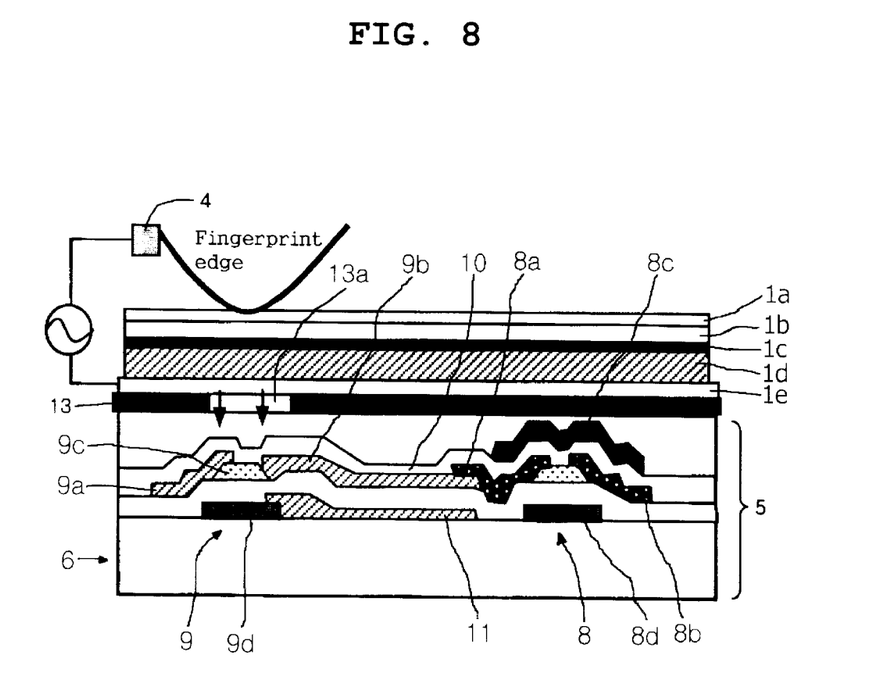
FIG. 8 is a cross-sectional view illustrating a fingerprint input device in accordance with a sixth embodiment of the present invention.

FIG. 8 is a cross-sectional view illustrating a fingerprint input device in accordance with a sixth embodiment of the present invention. As shown in FIG. 8, the fingerprint input device is similar to the fingerprint input device of the third embodiment of FIG. 5, and thus the difference thereof will now be explained. The light shielding pattern film 13 is positioned between the contact light emitting device and the top surface of the TFT fingerprint input device. The light shielding pattern film 13 is deposited on the TFT fingerprint input device 5. Here, the light shielding pattern film 13 is a black film pattern formed in an array shape of the light sensing unit of the TFT fingerprint input device 5, and includes an opening unit 13a for opening the light incidence layer. In addition, the transparent electrode layer 1e, the light emitting layer 1d, the light shielding layer 1c, the dielectric layer 1b and the water repellent layer (abrasion-resistant film) 1a are sequentially stacked on the light shielding pattern film 13.

Figure 9:
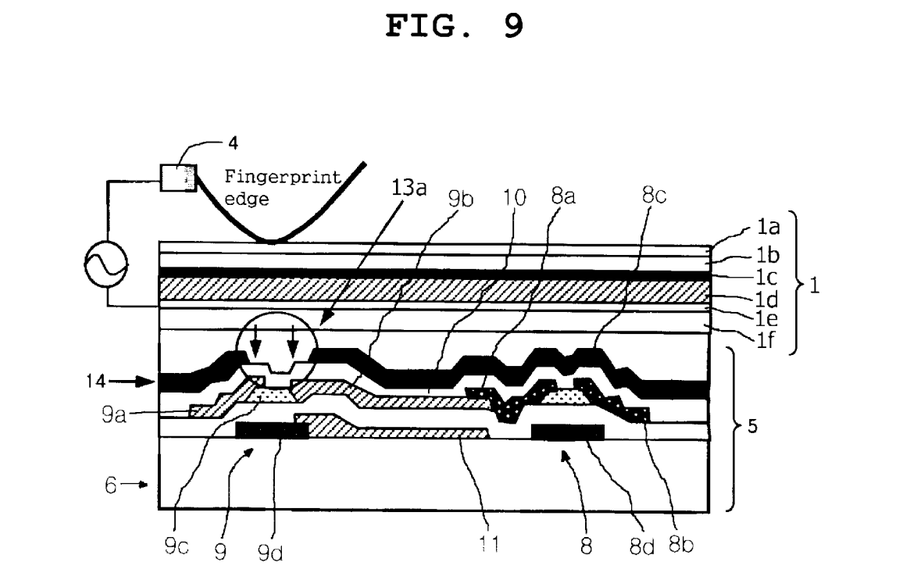
FIG. 9 is a cross-sectional view illustrating a fingerprint input device in accordance with a seventh embodiment of the present invention.

FIG. 9 is a cross-sectional view illustrating a fingerprint input device in accordance with a seventh embodiment of the present invention. As illustrated in FIG. 9, the fingerprint input device has a similar structure to the fingerprint input device of the first embodiment, but the difference thereof exists in a structure of the TFT fingerprint input device. In the TFT fingerprint input device, a light shielding layer 14 covers the whole area except for the opening unit 13a of the light sensing unit receiving light.

Figure 10:
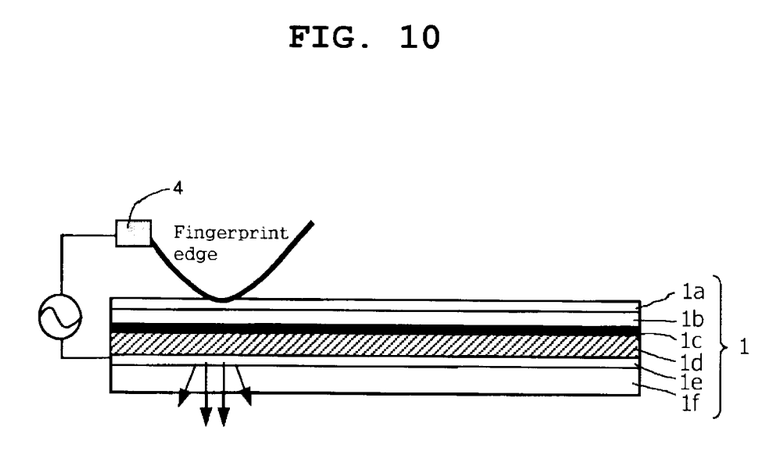
FIG. 10 is a cross-sectional view illustrating a fingerprint input device in accordance with an eighth embodiment of the present invention.

FIG. 10 is a cross-sectional view illustrating a fingerprint input device in accordance with an eighth embodiment of the present invention. As depicted in FIG. 10, the fingerprint input device is similar to the fingerprint input device of the seventh embodiment, but the difference thereof exists in a structure of the contact light emitting device. That is, the transparent electrode layer 1e is deposited on the TFT fingerprint input device 5, and the light emitting layer 1d, the light shielding layer 1c, the dielectric layer 1b and the water repellent layer (abrasion-resistant film) 1a are sequentially stacked thereon.

As discussed earlier, in accordance with the present invention, the slim type fingerprint input device can be used in various application fields. As compared with the general TFT fingerprint input device, the real incidence area is reduced to be equalized to the effective sensing area, to obtain high quality fingerprint images.

In addition, since the light emitting image is directly transmitted to the TFT light sensing unit by using the contact light emitting device and the TFT fingerprint input device, the interval (W) between the TFT light sensing unit and the switching unit is decreased, thereby obtaining fingerprint images of high resolution.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A slim type fingerprint recognition device comprising:
   a TFT fingerprint input device having a structure where a plurality of unit cells including a light sensing unit and a switching unit are aligned; and
   a contact light emitting device being installed on the TFT fingerprint input device, the TFT fingerprint input device and the contact light emitting device being adhered to each other by an adhesive layer, one alternating current terminal being connected to a transparent electrode layer of the contact type light emitting device.

2. The slim type fingerprint recognition device in accordance with claim 1, wherein the adhesive layer is prepared by mixing 55 to 60 wt % of epoxy adhesive, 5 to 10 wt % of polyvinyl butyral paste, 1 to 5 wt % of ethylene glycol monoethyl ether acetate, 1 to 5 wt % of n-butyl glycidyl ether, 1 to 5 wt % of defoamer, and 1 to 4 wt % of retardant.

3. The slim type fingerprint recognition device in accordance with claim 1, wherein the device further comprises a light shielding pattern film which is a black film pattern aligned on the top surface of the TFT fingerprint input device, the black pattern being opened only to a light incidence layer, thereby capable of transmitting light to the light incidence layer.

4. The slim type fingerprint recognition device in accordance with claim 1, wherein the device further comprises a polarizing layer which passes vertical incident light between the TFT fingerprint input device and the contact light emitting device.

5. The slim type fingerprint recognition device in accordance with claim 1, wherein the light sensing unit of the TFT fingerprint input device comprises:

a light incidence layer which receives incidence light from a light emitting device;

a drain and a source electrode connected to both sides of the light incidence layer;

an insulation layer formed on the surface of the drain and source electrode; and a light shielding layer formed on the insulating layer except an opening unit for exposing the light incidence layer; whereby the emitted image of the contact light emitting device is reached only to the light incidence layer by limitation of the light shielding layer.

6. A slim type fingerprint recognition device using a contact type light emitting device and a TFT fingerprint input device, comprising:

the TFT fingerprint input device having a structure where a plurality of unit cells including a light sensing unit and a switching unit are aligned; and the contact light emitting device installed on the TFT fingerprint input device, wherein the contact light emitting device comprises:

a transparent electrode layer directly deposited on the TFT fingerprint input device in a thin film type;

one alternating current terminal being connected to the transparent electrode layer;

a light emitting layer formed on the transparent electrode layer;

a light shielding layer formed on the light emitting layer;

a dielectric layer formed on the light shielding layer; and a water repellent layer formed on the dielectric layer, wherein the transparent electrode layer of the contact light emitting device is deposited on the top surface of the TFT fingerprint input device and then the light emitting layer, the light shielding layer, a dielectric layer and the water repellent layer are sequentially deposited.

7. The slim type fingerprint recognition device in accordance with claim 6, wherein the device further comprises a polarizing layer which passes vertical incident light between the TFT fingerprint input device and the contact light emitting device.

8. The slim type fingerprint recognition device in accordance with claim 6, wherein the polarizing layer is deposited on the top surface of the TFT fingerprint input device.

9. The slim type fingerprint recognition device in accordance with claim 6, wherein the polarizing layer is adhered on the top surface of the TFT fingerprint input device by an Epoxy-type adhesive.

10. The slim type fingerprint recognition device in accordance with claim 6, wherein the device further comprises a light shielding pattern film which is a black film pattern aligned on the top surface of the TFT fingerprint input device, the black pattern being opened only to a light incidence layer, thereby capable of transmitting light to the light incidence layer.

11. The slim type fingerprint recognition device in accordance with claim 6, wherein the light sensing unit of the TFT fingerprint input device comprises:

a light incidence layer which receives incidence light from a light emitting device;

a drain and a source electrode connected to both sides of the light incidence layer;

an insulation layer formed on the surface of the drain and source electrode; and a light shielding layer formed on the insulating layer except an opening unit for exposing the light incidence layer; whereby the emitted image of the contact light emitting device is reached only to the light incidence layer by limitation of the light shielding layer.

\* \* \* \* \*